(12) United States Patent
Yoshida et al.

(10) Patent No.: US 7,728,342 B2
(45) Date of Patent: Jun. 1, 2010

(54) LIGHT EMITTING APPARATUS METHOD FOR PRODUCING IT AND ASSEMBLY INCORPORATING IT

(75) Inventors: Kazuhiro Yoshida, Yamanashi (JP); Mitsunori Ishizaka, Yamanashi (JP)

(73) Assignee: Citizen Electronics Co., Ltd., Yamanashi (JP)

( * ) Notice: Subject to any disclaimer, the term of this patent is extended or adjusted under 35 U.S.C. 154(b) by 490 days.

(21) Appl. No.: 11/647,603

(22) Filed: Dec. 29, 2006

(65) Prior Publication Data
US 2007/0152229 A1     Jul. 5, 2007

(30) Foreign Application Priority Data
Dec. 29, 2005   (JP) .......................... P2005-380585

(51) Int. Cl.
*H01L 33/00* (2010.01)
(52) U.S. Cl. .......................... 257/98; 257/99; 257/100; 257/E33.058; 257/E33.059; 257/E33.073
(58) Field of Classification Search .................. 257/98, 257/99, 100, E33.058, E33.059, E33.061, 257/E33.072, E33.075, E33.073
See application file for complete search history.

(56) References Cited
FOREIGN PATENT DOCUMENTS

| JP | 2000 12576 A | 1/2000 |
|---|---|---|
| JP | 3137823 | 12/2000 |
| JP | 2003 31850 | 1/2003 |

*Primary Examiner*—Minh-Loan T Tran
(74) *Attorney, Agent, or Firm*—Browdy and Neimark, PLLC

(57) ABSTRACT

A light emitting apparatus including a substrate, at least one light emitting diode chip mounted on the substrate, a light-transmitting member disposed on the substrate to form a space between the light-transmitting member and the substrate, and a resin disposed in the space to seal the light emitting diode chip, the light-transmitting member including at least one resin-injection inlet and at least one air vent, the space being filled with the resin injected into the space through the resin-injection inlet.

15 Claims, 7 Drawing Sheets

LIGHT EMITTING APPARATUS METHOD FOR PRODUCING IT AND ASSEMBLY INCORPORATING IT

CROSS-REFERENCE TO THE RELATED APPLICATION

This application is based on and claims the priority benefit of Japanese Patent Application No. 2005-380585, filed on Dec. 29, 2005, the disclosure of which is incorporated herein by reference in its entirety.

BACKGROUND OF THE INVENTION

1. Field of the Invention

The present invention relates to a light emitting apparatus configured to illuminate a display or be used as a flash or the like in a camera, and which uses, in particular, a light emitting diode (LED) as a light source, a method for producing the light emitting apparatus and an assembly incorporating the light emitting apparatus.

2. Description of Related Art

In a light emitting apparatus configured to illuminate a display or be used as a flash or the like in a camera, and which uses, in particular, a light emitting diode (LED) chip as a light source, a potting system or transfer forming has been used in recent years as a process to seal the LED chip with a sealing resin.

With a light emitting apparatus using an LED chip as a light source, because it is usual to mix a colorant, pigment, phosphor or a combination thereof in the sealing resin to adjust color or chromaticity of light emitted from the LED chip, it is important to guarantee provision of a fixed amount of the sealing resin to achieve stable chromaticity.

However, the light emitting apparatus formed by either of the above-mentioned potting system or transfer forming has the following problems.

The first problem is that, although production facilities in the potting system are relatively inexpensive, because the injection time and injection pressure of the sealing resin are controlled by a machine, the amount of the sealing resin or phosphor injected varies according to mechanical accuracy. Also, because the potting system is easily influenced by environmental conditions, it is difficult to control the amount of the sealing resin. Consequently, it is difficult to stabilize chromaticity of the light emitted from the LED chip.

On the other hand, in the transfer forming, it is easier to control the amount of the sealing resin than in the potting system, but there are some problems such as restrictions on utilization of the sealing resin, increment of cost for production facilities because the mold is very expensive, influence of the mold release agent on the optical characteristics of the light emitting apparatus resulting from the fact that such a mold release agent must be mixed in the sealing resin to prevent the sealing resin from becoming adhered to the used mold, low level of adhesion between the sealing resin and other parts, and so on.

Furthermore, it has also been pointed out that, when a light emitting apparatus is formed by mounting an LED chip on a lead frame using transfer forming, there is no way of avoiding increased thickness of the light emitting apparatus thus formed (for reference, see Japanese Patent No. 3137823, paragraph 0007).

The second problem concerns the strength of the sealing resin to protect the LED chip.

Because the sealing resin is configured to be exposed without being covered by a cover or the like so as to output light from the light emitting apparatus, it is easily influenced by external forces. However, when a sealing resin with a high degree of hardness is used in order to reduce the influence of external forces, there is a reliability problem in that parts may become separated and the bonding wires to electrically connect the LED to the electrodes may be subjected to damage and tend to become greatly deformed when the LED chip is sealed by the sealing resin.

The third problem concerns heat-resistance of the sealing resin for sealing the LED chip.

For example, with a conventional sealing resin which might be made of epoxy, because it is difficult for heat emitted from the LED to be released, the light emitting apparatus suffers the undesirable problem of a cycle of "heating up→lowering of VF value→further increment of current→further heating up exceeding absolute maximum specified rate→departure form assured range".

Some proposals have been made to resolve the above-mentioned problems.

For example, in one proposal a hole is provided in a substrate and an LED chip is mounted on a metallic portion provided on a back surface of the substrate facing the hole to improve heat release characteristics from the LED chip and achieve a thinned light emitting device with improved emission efficiency (for reference, see Japanese Patent No. 3137823).

However, in this proposal, the above-mentioned first problem concerning stabilization of color and second problem concerning strength of the sealing resin have still not been resolved.

There is also a proposal which basically relates the same method as that disclosed in Japanese Patent No. 3137823, more specifically, a method in which a hole is provided in a substrate and a sealing resin of an LED chip may be formed by a transfer-mold (for reference, see Japanese Patent Laid-Open No. 2003-31850).

However, in this proposal, there is no intention at all to resolve the first problem concerning stabilization of color and the second problem concerning strength of the sealing resin.

There is a further proposal to stabilize color by reducing the air bubbles in a sealing resin when forming the sealing resin having low heat resistance and a thinned shape (for reference, see Japanese Patent Laid-Open No. 2000-12576).

However, what is disclosed in this proposal is a structure which presupposes that if there are no air bubbles in a sealing resin, the color is stable. Therefore, if there is the slightest amount of air bubbles, it is difficult to obtain a stable color.

SUMMARY OF THE INVENTION

An object of the present invention is to provide a highly-reliable light emitting apparatus.

To accomplish the above object, a light emitting apparatus according to one embodiment of the present invention includes a substrate, at least one light emitting diode chip mounted on the substrate, a light-transmitting member having a concave portion and disposed on the substrate to form a space between the concave portion of the light-transmitting member and the substrate, and a resin disposed in the space to seal the light emitting diode chip.

The light-transmitting member includes at least one resin-injection inlet and at least one air vent. The space is filled with the resin injected into the space through the resin-injection inlet.

In one example, the resin includes at least one chromaticity-adjusting member selected from among a colorant, pigment, phosphor or a combination thereof.

DETAILED DESCRIPTION OF THE PREFERRED EMBODIMENTS

Preferred embodiments of the present invention will be explained in detail with reference to the accompanying drawings below.

Figure 1A:
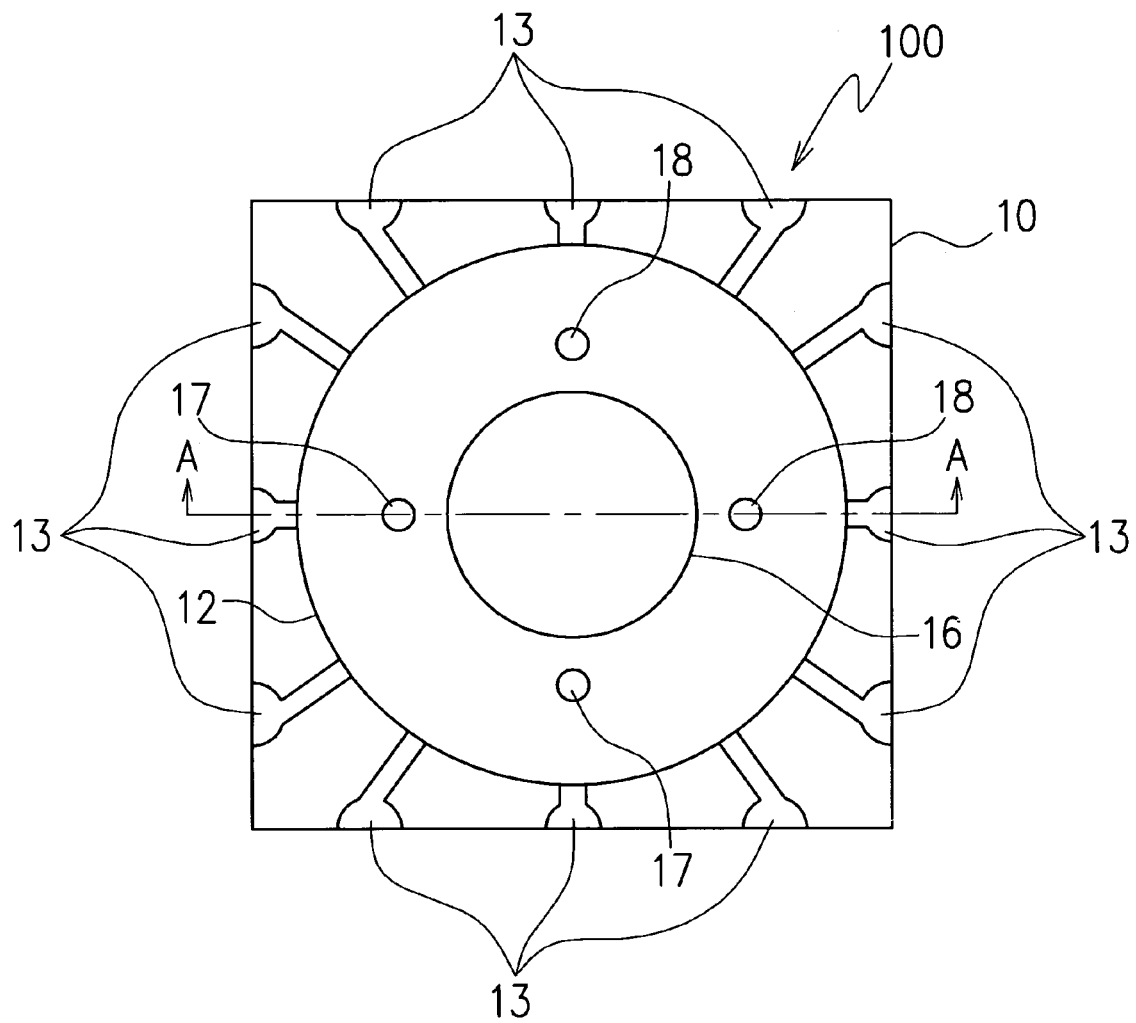
FIG. 1A is a plan view showing a first embodiment of a light emitting apparatus according to the present invention.
Figure 1B:
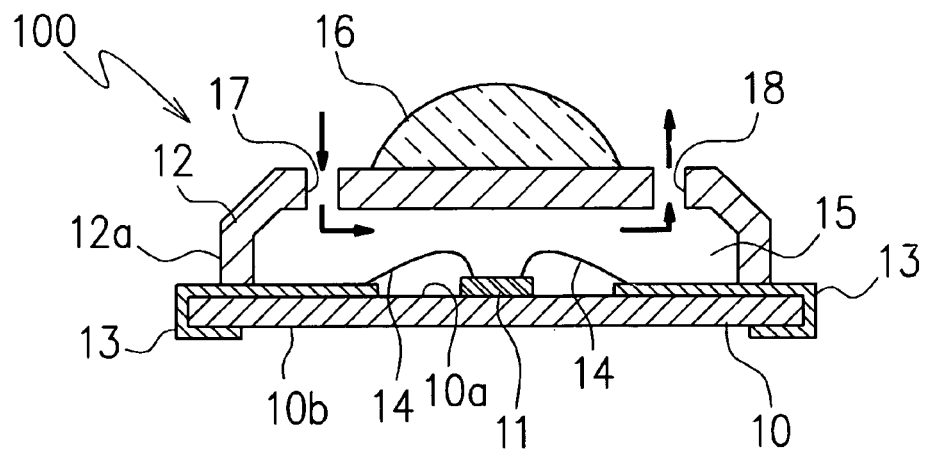
FIG. 1B is a sectional view taken along the A-A line in FIG. 1A, in the state without sealing resin.
Figure 2:
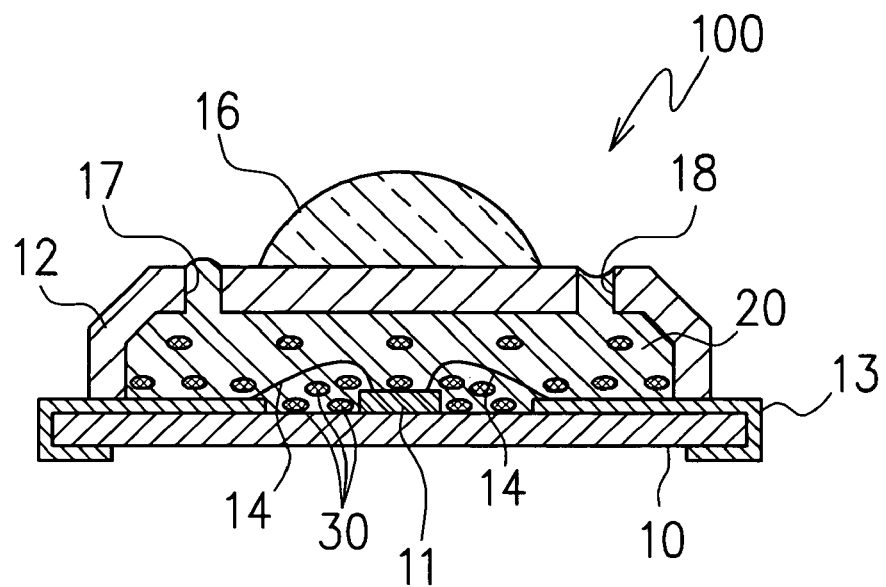
FIG. 2 is a sectional view taken along the A-A line in FIG. LA, with a resin including at least one chromaticity-adjusting member.

FIGS. 1A, 1B and 2 illustrate a first embodiment of a light emitting apparatus according to the present invention.

The light emitting apparatus 100 in the first embodiment includes an insulating substrate 10, at least one LED chip 11 disposed on one surface, for example, an upper surface 10a of the substrate 10 and a light-transmitting member 12 made of transparent or translucent material disposed to surround the LED chip 11.

The substrate 10 has, for example, a generally square shape, as shown in FIG. 1A and the LED chip 11 is disposed, for example, at a generally central portion of the upper surface 10a of the substrate 10 (see FIG. 1B).

A plurality of electrodes 13 for the LED chip 11 are provided on the substrate 10. In this embodiment, three electrodes 13 are disposed on each of four sides of the substrate 10, thus a total of twelve electrodes 13 are provided on the substrate 10.

The LED chip 11 can be lighted, if a minimum of two electrodes 13 are provided, but it is preferable to provide as many electrodes 13 as possible as shown in FIG. 1A to achieve increased power consumption of the LED chip 11.

As shown in FIG. 1B, the LED chip 11 is die-bonded at the generally central portion of the upper surface 10a of the substrate 10, and two upper electrodes of the LED chip 11 are electrically connected to the electrodes 13 provided on the substrate 10 through bonding wires 14 which comprise fine metallic wires. The electrodes 13 provided on the substrate 10 are electrically connected to externally-connecting terminals (not shown) provided on a lower surface 10b of the substrate 10 (FIG. 1B) or a rear surface of the light emitting apparatus 100 via, for example, through-holes formed in edge portions of the substrate 10, as shown in FIGS. 1A and 1B.

The light-transmitting member 12 is made of, for example, a transparent or translucent resin having a relatively high degree of hardness, and has a concave portion (see FIGS. 1B and 2). The light-transmitting member 12 is disposed to close the concave portion with the substrate, and a peripheral edge portion of the light-transmitting member surrounding the concave portion is hermetically-sealed on the upper surface 10a of the substrate 10 (see FIG. 1B). Thereby, a space 15 is provided between the concave portion of the light-transmitting member 12 and the substrate 10 (see FIG. 1B).

The light-transmitting member 12 includes a lens part 16 which is integrally provided as a part of the light-transmitting member and the lens part faces an emission surface of the LED chip 11, in other words, a generally central portion of the light-transmitting member 12 covering the emission surface of the LED chip, at least one resin-injection inlet 17 provided kept out of the lens part 16 and at least one air vent 18. In this embodiment, four holes are provided kept out of the lens part 16, at least one of which is used as the resin-injection inlet 17 and at least another one of which is used as the air vent 18.

In this embodiment the lens part 16 comprises a convex lens and functions to gather light emitted from the LED chip 11 and emit the gathered light from the light emitting apparatus 100 to the outside.

A resin 20 is injected through the resin-injection inlet 17 into the space 15 between the concave portion of the light-transmitting member 12 and the substrate 10, thereby filling the space 15 with the resin to seal the LED chip 11 (see FIG. 2).

FIG. 1B illustrates a light-emitting apparatus where the space 15 is not filled with the resin 20, while FIG. 2 illustrates a state where the space 15 is filled with the sealing resin 20.

The resin 20 comprises a transparent or translucent resin including at least one chromaticity-adjusting member selected from among a colorant, pigment, phosphor or a combination thereof to adjust color or chromaticity of the light emitted from the LED chip 11. The resin or the resin 20 including the chromaticity-adjusting member is injected through the resin-injection inlet 17 into the space 15. At this time, air in the space 15 is ejected via the air vent 18 to the outside of the light-transmitting member 12, thus preventing generation of air bubbles or uneven thickness of the resin 20 injected into the space 15.

It is preferable to select as soft a resin as possible for the resin 20 injected into the space 15. This reduces damage to the bonding wires 14 connecting the LED chip 11 and the electrodes 13 and achieves a relaxation of the stresses on the entire light-transmitting member 12, when the resin 20 is injected into the space 15.

The composition of the resin 20 injected into the space 15 is set so as to harden ordinarily, but it is confirmed that the at least one chromaticity-adjusting member 30 mixed in the resin 20 tends to settle and its position become stabilized.

As is clear from FIG. 2, it is possible to achieve significant stabilization of the chromaticity of the light which is emitted from the LED chip 11 and further emitted to the outside of the light emitting apparatus 100 through the lens part 16, because the amount and thickness of the resin 20 are kept constant, so the chromaticity-adjusting member is constant. This is a significant merit of the light emitting apparatus 100.

By contrast, in the conventional potting method, for example, it is difficult to control the amount of the sealing resin, and hence variations in chromaticity of the light emitted from the LED chip occur because the amount of the resin in an exit direction of the light depends on surface tension of the resin itself, and so on.

Also, in contrast to conventional transfer forming, it is not necessary to mix a mold release agent in the sealing resin 20 which includes the chromaticity adjusting member. It is therefore possible to eliminate problems in which, for example the mold release agent affects the optical characteristics of the light emitting apparatus, or that there is a low level of adhesion between the resin and each of the other parts in the light emitting apparatus. In addition, it is possible to achieve a low production cost for the light emitting apparatus because there is no need for the mold used in transfer forming.

Furthermore, by using silicon having a refractive index of about 1.4 as the injected sealing resin 20 and by using something with a refractive index greater than 1.4, for example, an epoxy lens with a refractive index of about 1.55 as the light-transmitting member 12, when the light emitted from the LED chip 11 leaves the sealing resin 20 comprising silicon with a refractive index of 1.4 and enters the light-transmitting member 12 comprising the epoxy lens with a refractive index of 1.55, secure focusing of light can be achieved because the angle of refraction is less than the angle of incidence.

What is important in FIG. 2 is that the LED chip 11 is surrounded by the relatively soft resin 20 including the at least one chromaticity-adjusting member and the resin 20 is surrounded by the relatively rigid light-transmitting member 12 having a centrally disposed lens part 16. The resin 20 includes the at least one chromaticity adjusting member. In this way, because the LED chip 11 is covered by two kinds of resin members; the relatively soft resin 20 and the relatively rigid light-transmitting member 12 enclosing the relatively soft resin 20 with the substrate 42. In other words, the rigid light-transmitting member 12 acts as a cover for the resin 20 thus reducing the influence of external forces upon the resin 20 and the LED chip 11. In addition, because the soft resin 20 is used, damage to the bonding wires 14 connecting the LED chip 11 and the electrodes 13 can be reduced, when the resin is injected into the space 15.

Figure 3:
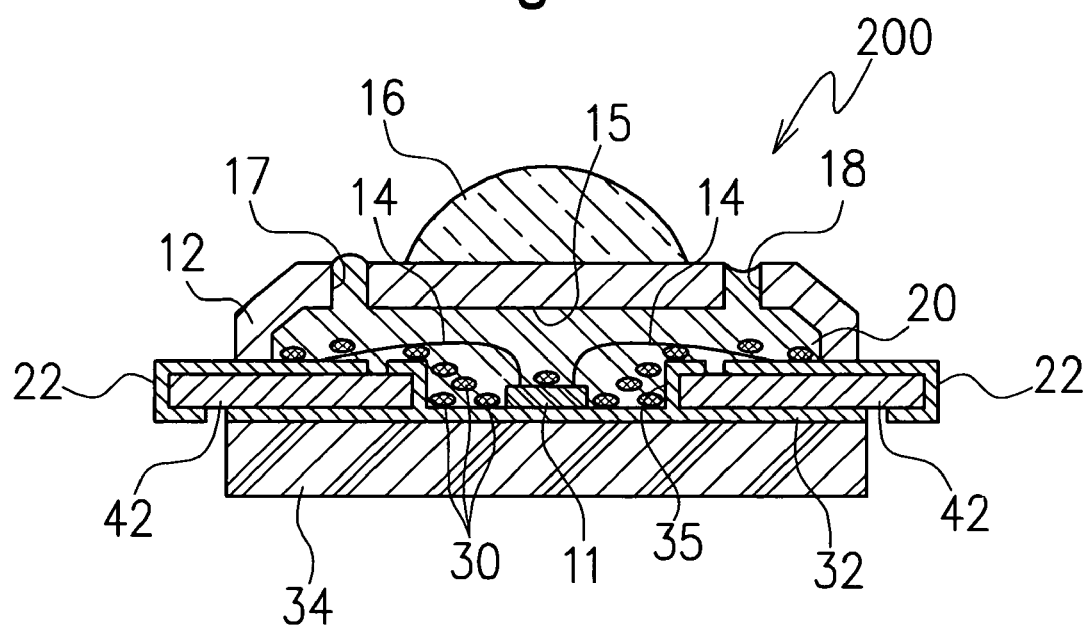
FIG. 3 is a sectional view showing a second embodiment of the light emitting apparatus according to the present invention.

FIG. 3 illustrates a second embodiment of the light emitting apparatus according to the present invention.

In the light emitting apparatus 200 in the second embodiment, the LED chip 11 is die-bonded on, for example, a reflective concave portion 35 formed on a hole of the insulating substrate 42, as shown in FIG. 3. Upper electrodes of the LED chip 11 are electrically connected to electrodes 22 provided on an insulative substrate 42 through the bonding wires 14 comprising fine metallic wires. The light emitting apparatus 200 in the second embodiment differs from the light emitting apparatus 100 in the first embodiment in that the reflective concave portion 35 for mounting the LED chip 11 is formed by metal. The reflective concave portion 35 can be formed by the same material as the electrodes 22 and the reflective concave portion 35 extended from the bottom thereof along a lower surface of the insulative substrate 42. The extended reflective portion 32 work as a heat-release surface. It should be noted that identical reference numbers are used to indicate parts of the light emitting apparatus 200 in the second embodiment, which are identical to parts of the light emitting apparatus 100 in the first embodiment, and a description of those parts is omitted.

In the second embodiment, the electrodes 22 correspond to the electrodes 13 shown in FIGS. 1A and 2, and end portions of the electrodes are formed as externally connecting terminals (not shown) disposed on the opposite side of the insulative substrate 42 via through-holes, in a similar way to the electrodes 13.

In the second embodiment, the LED chip 11 is mounted in a reflective concave portion 35 for the LED chip 11 being surrounded by a reflective concave portion 35 in a hole of the insulative plate 42; because the structure of the concave portion and method for forming the concave portion are known, a description thereof is omitted.

In the second embodiment, the extended reflective portion 32 is disposed on a block 34. The block 34 is made of, for example, a metal or ceramic, and is formed so as to release heat from the LED chip 11 through reflective concave portion 35 and the extended reflective portion 32 to the outside of the light-transmitting member 12.

Similarly to the first embodiment, the resin or the resin 20 including the chromaticity adjusting member is injected through the resin-injection inlet 17 into the space 15 to seal the LED chip 11. In addition, the chromaticity adjusting member can select at least one from among a colorant, pigment, phosphor, or a combination thereof 30 is mixed in the resin 20.

In the second embodiment also, because the light-transmitting member 12 can be made of a relatively rigid material, the resin 20 protected by the light-transmitting member 12 made of the rigid material can be made of a very soft material, and it is therefore possible, in the same way as in the first embodiment, to reduce damage to the bonding wires 14 and ease the stresses acting on the light-transmitting member 12 when injecting the resin 20.

The above-mentioned structure of the second embodiment makes it possible to provide a light emitting apparatus which has a high heat release characteristic, while maintaining the effects of stable chromaticity of emitted light and robustness to external forces which have been described for the light emitting apparatus 100 as shown in FIGS. 1A, 1B and 2.

A light emitting apparatus with a high power consumption generally has a serious problem with the breakdown-inducing cycle of "heating up→lowering of VF value→further increment→of current→further heating up exceeding absolute maximum specified rate→departure from assured range". Here, VF means variable frequency.

The light emitting apparatus in the second embodiment can resolve this problem because it has the high heat release characteristic.

Figure 4:
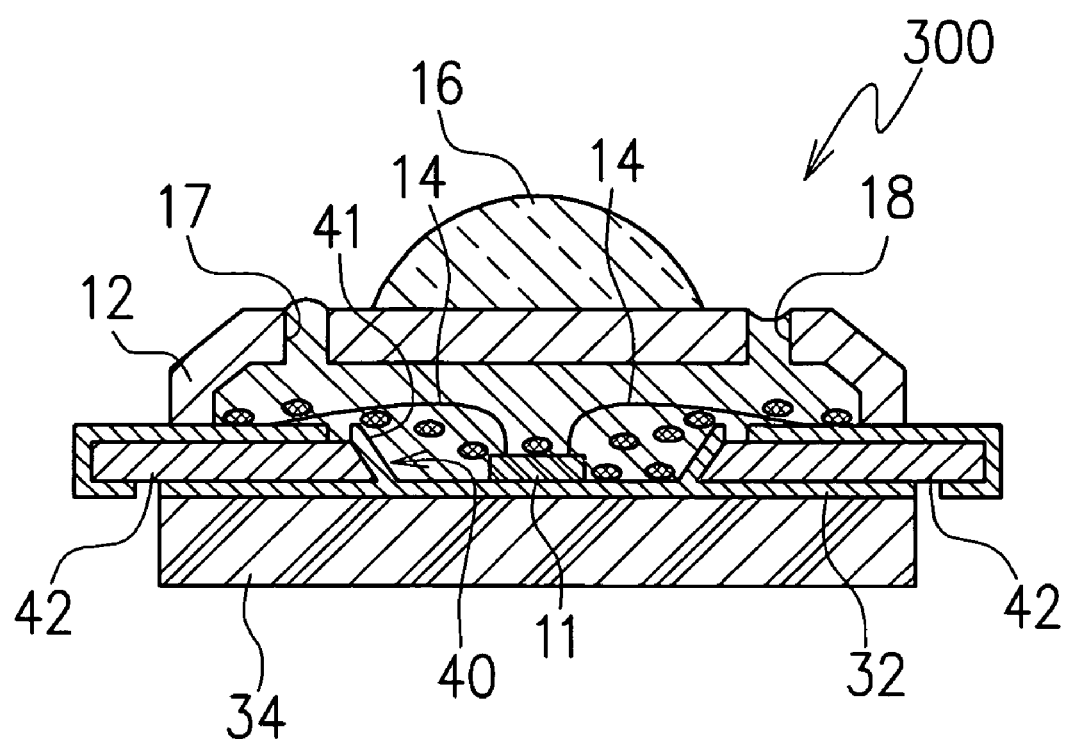
FIG. 4 is a sectional view showing a third embodiment of the light emitting apparatus according to the present invention.

FIG. 4 illustrates a third embodiment of the light emitting apparatus according to the present invention.

In the light emitting apparatus 300 in the third embodiment, identical reference numbers are attached to parts that are the same as those in the light emitting apparatus 200 in the second embodiment. The light emitting apparatus 300 differs from the light emitting apparatus 100 in the first embodiment in that the LED chip 11 is mounted on a reflection part 40.

The reflection part 40 has a cup-like shape, an upper end of which is opened, and includes a reflecting bottom surface on which the LED chip 11 is mounted and a reflection surface 41 provided to surround the light emitting diode chip 11. The reflection surface surrounding the light-emitting diode chip tilts upward with a focus on a light-emitting surface of the light emitting surface of the light emitting diode chip. The light emitting apparatus 300 differs from the light emitting apparatus 200 in the second embodiment in that the reflection part 40 includes the reflection surface 41. The reflection part 40 is structured to reflect the light emitted from the LED chip 11 to improve efficiency of utilization and directivity of the light.

With this structure, it takes few instances of reflection for the light emitted from a side or sides of the LED chip 11 to be directed in an upward direction and it is easy for it to be focused in an upward direction, so that increased efficiency of utilization and improved directivity can be achieved.

Figure 5A:
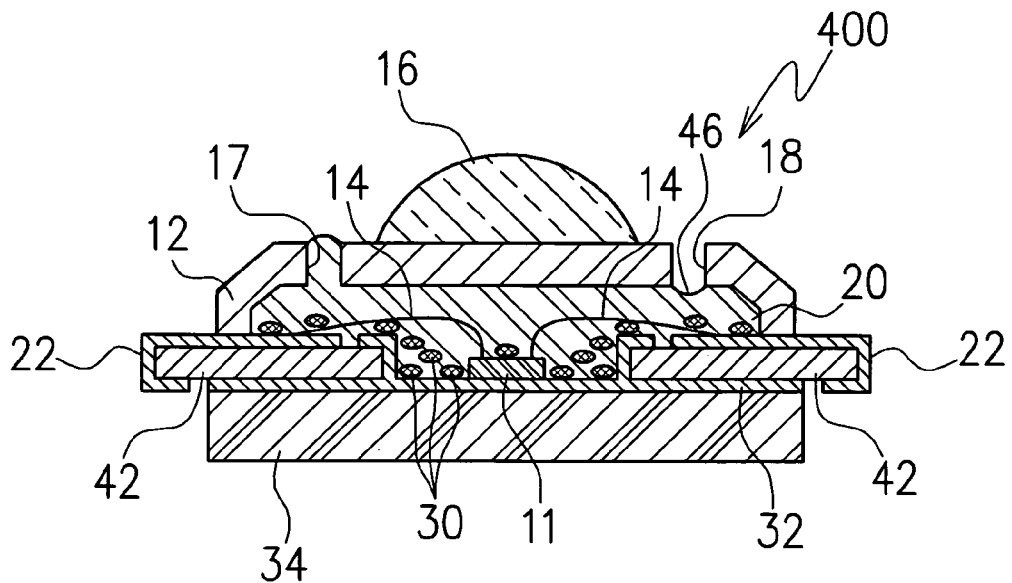
FIG. 5A is a sectional view showing a fourth embodiment of the light emitting apparatus according to the present invention.
Figure 5B:
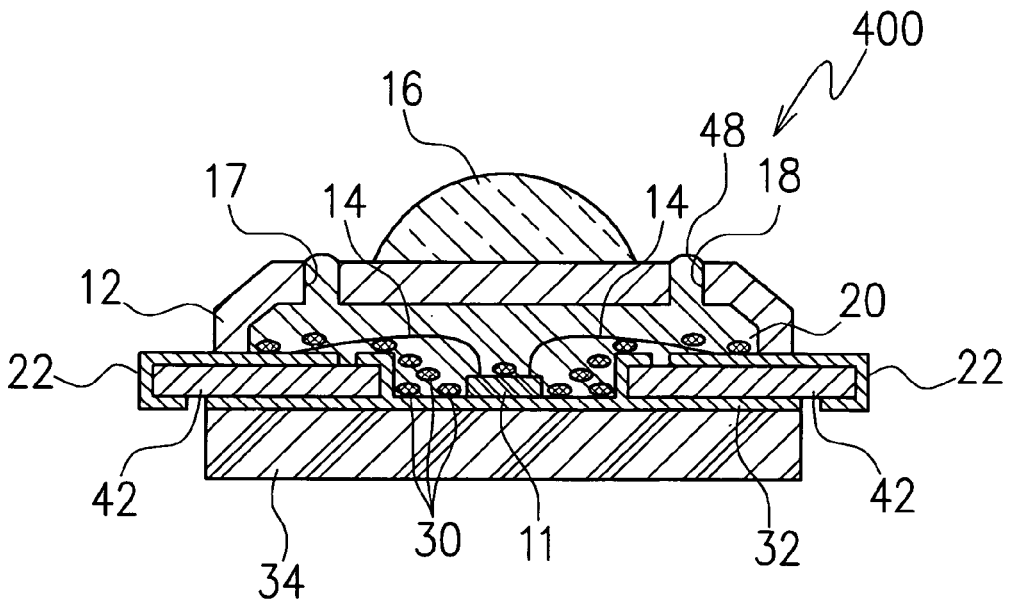
FIG. 5B is a sectional view showing a second embodiment of the light emitting apparatus according to the present invention, in which the amount of resin is slightly different from that in the light emitting apparatus shown in FIG. 5A.

FIGS. 5A and 5B illustrate a fourth embodiment of the light emitting apparatus according to the present invention.

The light emitting apparatus 400 in the fourth embodiment has generally the same structure as the light emitting apparatus 200 in the second embodiment shown in FIG. 3. However, the fourth embodiment exhibits two forms in which the amount of the resin or the resin 20 including the at least one chromaticity-adjusting member.

FIG. 5A illustrates a state in which the amount of the resin 20 is slightly reduced and FIG. 5B illustrates a state in which the amount of the resin 20 is slightly increased.

As shown in FIGS. 5A and 5B, only the shape of the resin 20 in the vicinity of the air vent 18 changes as shown at 46 and 48, whereas the direction in which light is emitted in the light emitting apparatus in the cases either when the amount of resin is slightly reduced or when the amount of resin is slightly increased remain unchanged. Therefore, in contrast to the conventional potting method, it is possible to obtain stable chromaticity of the emitted light even if there is some variation in the amount of the resin.

The fact that the direction in which light is emitted from the light emitting apparatus does not change with variations of the amount of the resin 20 can, of course, be applied similarly to the light emitting apparatus in the first embodiment shown in FIGS. 1 and 2.

Figure 6:
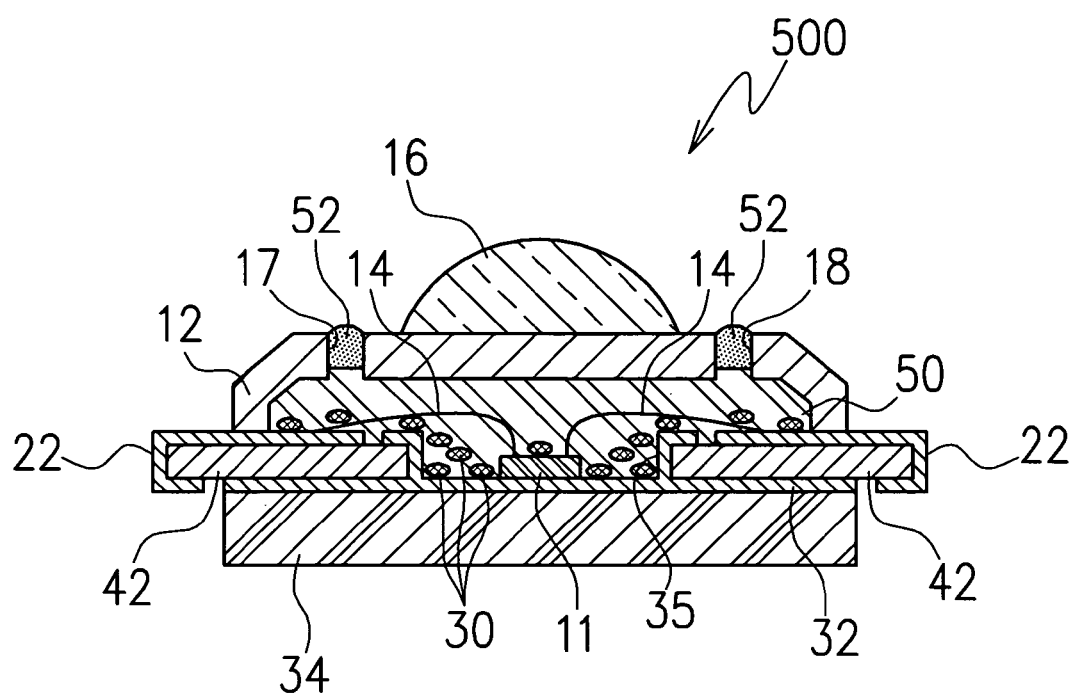
FIG. 6 is a sectional view showing a fifth embodiment of the light emitting apparatus according to the present invention, in which liquid resin is used.

FIG. 6 illustrates a fifth embodiment of the tight emitting apparatus according to the present invention.

The light emitting apparatus 500 in the fifth embodiment differs from the light emitting apparatus 200 in the second embodiment shown in FIG. 3 in that liquid or fluid sealing resin 50 including the at least one chromaticity-adjusting member is used, and the resin-injection inlet 17 and the air vent 18 are closed by plugs 52.

When the liquid resin 50 including the at least one chromaticity-adjusting member is used in this way, because the resin including the at least one chromaticity-adjusting member is formed simply by pouring the liquid resin through the resin-injection inlet 17 into the space 15 of the light-transmitting member 12 and closing the resin-injection inlet 17 and the air vent 18 with the plugs 52, the filling operation of the resin becomes extremely straightforward. The composition of the liquid resin 50 is set appropriately so that the resin including the chromaticity adjusting material is maintained in a liquid state while the light emitting apparatus is operated.

It should be noted that, even if heat convection occurs, finely-sized particles of the colorant, pigment or phosphor 30 are adjusted so as to undergo convection in a uniformly dispersed state along with the color-adjusting resin 50; large-sized particles of the phosphor or the like 30 remain deposited and are adjusted so as not to undergo convection or the like along with the resin 50.

Because the liquid resin 50 is used in this way, it is possible for the resin to be moved by convection due to the heat emitted from the LED chip 11, and this gives rise to the advantageous effects that it is difficult for changes to occur in the resin due to ultraviolet from, for example, a blue LED chip and that changes in the resin over time are prevented. Because the liquid resin 50 including at least one chromaticity-adjusting member selected from among a colorant, pigment or phosphor, or a combination thereof 30 is poured through the resin-injection inlet 17 into the space 15, the colorant, pigment or phosphor 30 is uniformly dispersed in the resin 50, and this gives rise to the advantageous effect that good balance of color of the emitted light can be achieved.

In the case that the reflective concave portion 35 is integrally formed with the extended portion 32 extending along a lower surface of the insulative substrate 42. Because the LED chip 11 is disposed in the reflective concave portion 35, the at least one chromaticity-adjusting member 30 tends to be collected in the vicinity of the LED chip 11 the advantageous effect of improved light conversion efficiency can be achieved.

In addition, when gelled resin is added to the liquid resin 50 including at least one chromaticity-adjusting member selected from among a colorant, pigment, phosphor, or a combination thereof 30, the chromaticity-adjusting member 30 can be dispersed even more uniformly in the resin 50.

When the liquid resin 50 is used in this way, the heat from the light emitting source or LED chip 11 is released by heat flow of the liquid resin, so that the heat release characteristics of the light emitting apparatus are significantly improved, and there is a consequent enhancement in reliability. In addition, because the liquid resin is very soft, there is an easing of the stresses acting on the light-transmitting member 12 and damage to the bonding wires 14 can be significantly reduced.

Figure 7:
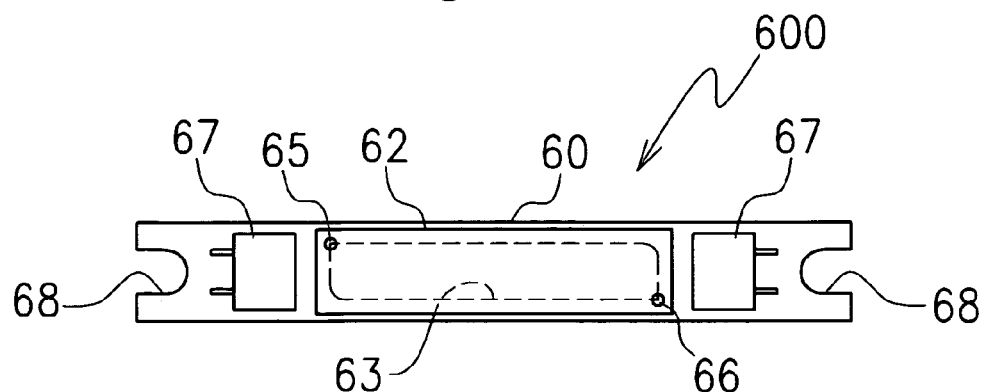
FIG. 7 is a plan view showing a sixth embodiment of the light emitting apparatus according to the present invention.
Figure 8:
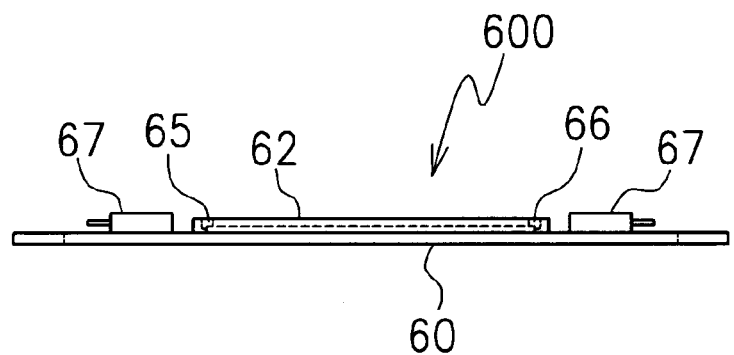
FIG. 8 is a side view of the light emitting apparatus shown in FIG. 7.
Figure 9:
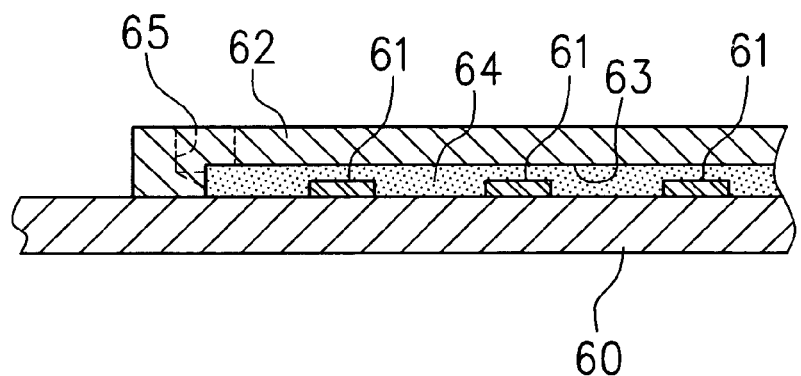
FIG. 9 is a partial sectional view of the light emitting apparatus shown in FIG. 7.

FIGS. 7 to 9 illustrate a sixth embodiment of the light emitting apparatus according to the present invention.

The light emitting apparatus 600 in the sixth embodiment includes a thin elongate rectangular plate-like substrate 60, one or more LED chips 61 (see FIG. 9) disposed on the substrate 60, an elongate rectangular light-transmitting member 62 disposed to cover the LED chips 61 and a resin 64 (see FIG. 9) contained in a space 63 formed between the light-transmitting member 62 and the substrate 60. Each of the LED chips 61 includes an anode electrode and a cathode electrode. The light-transmitting member 62 includes at least one resin-injection inlet 65 and at least one air vent 66 (see FIGS. 7 and 8). In this embodiment, the resin-injection inlet 65 and the air vent 66 are disposed diagonally opposite each other on the rectangular light-transmitting member 62 (see FIGS. 7 and 8). By disposing the resin-injection inlet 65 and the air vent 66 at two positions as remote as possible from each other (for example, diagonally opposite each other) on the upper surface of the light-transmitting member 62, it is possible to secure a constant amount of resin 64.

Although the resin 64 is injected through the resin-injection inlet 65 into the space 63, when it is injected, air in the space 63 is expelled from the air vent 66.

The light emitting apparatus in the sixth embodiment includes a pair of plugs 67 provided on the substrate 60 at opposite sides of the light-transmitting member 62. The plugs 67 are configured to be connected to external sockets (not shown). Connection of the plugs 67 to the sockets causes the LED chips to light.

The light emitting apparatus 600 in this embodiment includes cutouts 68 provided at opposite ends of the substrate 60. The light emitting apparatus 600 is fixed to some mounting member (not shown) by, for example, threading screws (not shown) through the cutouts 68 into threaded holes provided in the mounting member.

The sixth embodiment makes possible provision of a very thin light emitting apparatus 600.

Figure 10:
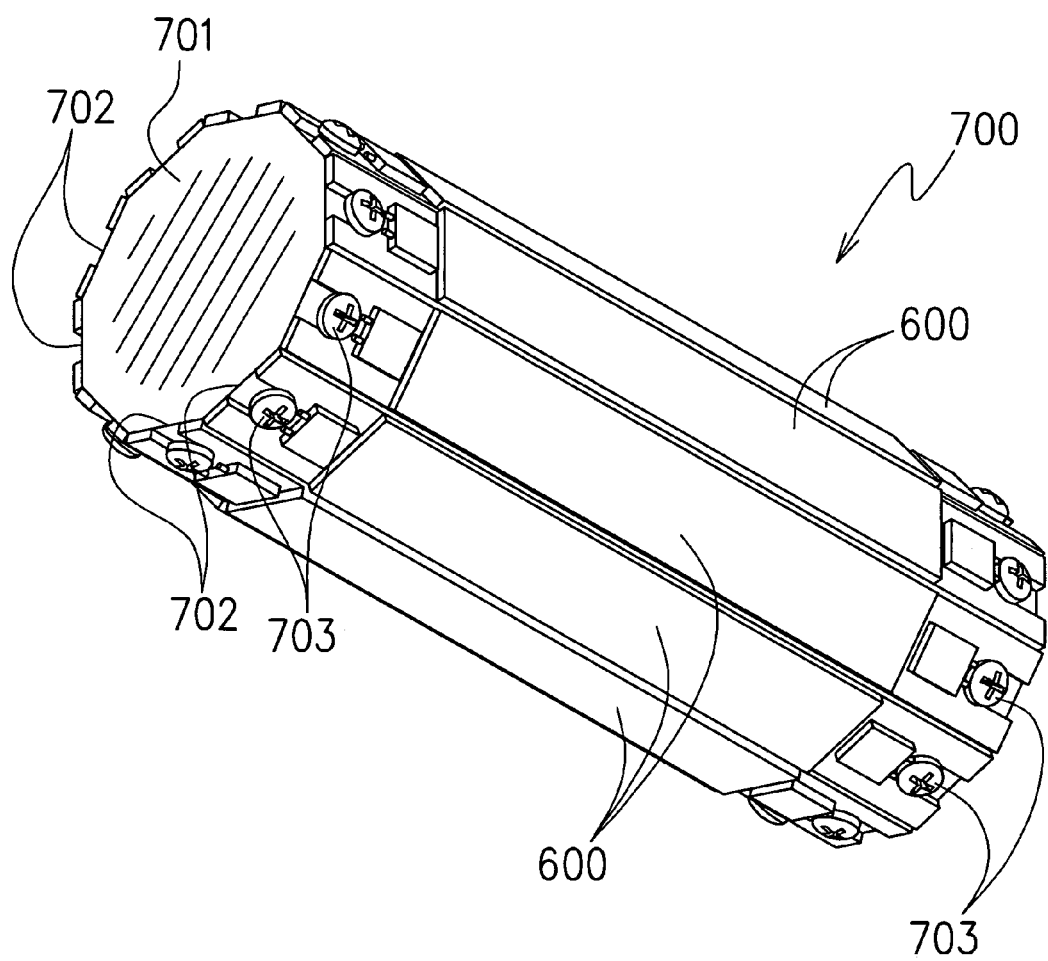
FIG. 10 is a perspective view showing an assembly incorporating the light emitting apparatus, which is one application of the light emitting apparatus shown in FIG. 7.

FIG. 10 illustrates one example of an application of the light emitting apparatus in the sixth embodiment.

In this application, a plurality of light emitting apparatuses 600 each of which is structured according to the sixth embodiment are spatially disposed to form an assembly 700 of light emitting apparatuses.

More specifically, the plurality of light emitting apparatuses 600 are attached, respectively, by way of screws 703, to a plurality of flat surfaces 702 which are provided, for example, around a bar-like mounting member 701 having a polygonally shaped post. When the plurality of light emitting apparatuses 600 are disposed in a polygonal shape in this way, it is possible to provide a light emitting source of high brightness which emits light three-dimensionally.

Meanwhile, it is preferable that the mounting member 701 is formed by a material which allows easy release of the heat emitted from the plurality of light emitting apparatuses 600. The mounting member 701 may be formed in a hollow shape to facilitate the release of heat.

Alternatively, if the plurality of light emitting apparatuses 600 are arranged in a plane (not shown), it is possible to provide a planar light emitting source (panel module type) of high brightness, and if the plurality of light emitting apparatuses are arranged in series or tandem (not shown), it is possible to provide a linear light emitting source (line module type). Of course, it is also possible to arrange the plurality of light emitting apparatuses in a circle.

According to the above-mentioned first to sixth embodiments, because the space surrounded by the light-transmitting member is filled with the resin or the resin including the at least one chromaticity-adjusting member through the resin-injection inlet, it is possible to keep the amount the resin controlled at a fixed amount; consequently the chromaticity of light emitted from the LED chip can be accurately stabilized.

It is also possible to set the viscosity of the sealing resin injected into the light-transmitting member at a reduced level, so that stresses on the light-transmitting member can be relaxed and damage to the bonding wires reduced when the resin is injected.

Moreover, the influence of a mold release agent can be eliminated, because a conventional transfer forming is not used for forming the sealing resin. As a result, production costs can be reduced, because a mold is not required.

Moreover, because the light-transmitting member of relatively high hardness is disposed outside the resin which acts as the sealing resin, the translucent member acts as a cover, so that the influence exerted on the resin by external forces can be reduced.

Furthermore, because a die-bond area of the substrate to which the LED chip is bonded is formed by the metallic portion and the heat which is retained in the LED chip can be effectively released from the metallic portion of the die bond area, it is possible to provide a compact light emitting apparatus of high reliability and high output.

Furthermore, in the embodiment in which the resin is held in a liquid state during operation of the light emitting apparatus, it is possible to release the heat of the LED chip light emitting source with high efficiency by means of heat flow in the resin and the metallic portion of the die-bond area, thereby securing high reliability and achieving high output.

In addition, a light emitting apparatus having as thin a shape as possible and high brightness can be provided.

Although the preferred embodiments of the present invention have been described, it should be noted that the present invention is not limited to these embodiments, and various changes and modifications can be made to the embodiments.

What is claimed is:

1. A light emitting apparatus, comprising:
   a substrate;
   at least one light emitting diode chip mounted on the substrate; and
   a light-transmitting member disposed on the substrate and having a concave portion to form a space between the light-transmitting member and the substrate;
   wherein the light-transmitting member includes at least one resin-injection inlet and at least one air vent disposed opposite one another at an upper surface of the light-transmitting member.

2. The light emitting apparatus according to claim 1, further comprising a resin being disposed in the space to seal the light emitting diode chip on the substrate.

3. The light emitting apparatus according to claim 2, wherein at least one chromaticity adjusting member selected from among a colorant, pigment, phosphor or a combination thereof is mixed in the resin.

4. The light emitting apparatus according to claim 2, wherein the resin is liquid state.

5. The light emitting apparatus according to claim 1, wherein the at least one resin-injection inlet and the at least one air vent are diagonally disposed.

6. The light emitting apparatus according to claim 1, further comprising a lens part integrally provided as a part of the light-transmitting member.

7. The light emitting apparatus according to claim 1, wherein a mounting portion of the light emitting diode chip on the substrate is metal-coated.

8. The light emitting apparatus according to claim 1, further comprising a reflection surface provided on the substrate and surrounding the light emitting diode chip.

9. The light emitting apparatus according to claim 8, wherein the reflection surface surrounding the light emitting diode chip tilts upward with a focus on a light emitting surface of the light emitting diode chip.

10. A method for producing a light emitting apparatus, comprising:
    mounting at least one light emitting diode chip on a substrate;
    preparing a light-transmitting member which includes at least one resin-injection inlet and at least one air vent disposed opposite one another at an upper surface of the light-transmitting member, and a concave portion configured form a space between the light-transmitting member and the substrate;
    disposing the light-transmitting member on the substrate to cover the light emitting diode chip in the concave portion; and
    filling the space with a resin to seal the light emitting diode chip.

11. An assembly of light emitting apparatuses, comprising:
    a plurality of light emitting apparatuses which are arranged in a predetermined configuration,
    each of the plurality of light emitting apparatuses including;
    a substrate,
    at least one light emitting diode chip mounted on the substrate,
    a light-transmitting member having at least one concave portion and disposed on the substrate to form a space with the concave portion and the substrate, and
    a resin disposed in the space to seal the light emitting diode chip,
    wherein the light-transmitting member includes at least one resin-injection inlet and at least one air vent disposed opposite one another on an upper surface of the light-transmitting member, and the space is filled with the resin.

12. The assembly according to claim 11,
wherein the predetermined configuration is generally polygonal, series or planar.

13. The assembly according to claim 12,
wherein the at least one resin-injection inlet and the at least one air vent in each of the plurality of light emitting apparatuses are diagonally disposed.

14. A light emitting apparatus, comprising:
a substrate;
at least one light emitting diode chip mounted on the substrate; and
a light-transmitting member disposed on the substrate and having a concave portion to form a space between the light-transmitting member and the substrate,
a resin being disposed in the space to seal the light emitting diode chip on the substrate,
wherein the light-transmitting member includes at least one resin-injection inlet and at least one air vent, and the resin-injection inlet and the air vent are diagonally disposed.

15. An assembly of light emitting apparatuses, comprising:
a plurality of light emitting apparatuses which are arranged in a predetermined configuration,
each of the plurality of light emitting apparatuses including:
a substrate,
at least one light emitting diode chip mounted on the substrate,
a light-transmitting member having at least one concave portion and disposed on the substrate to form a space with the concave portion and the substrate, and
a resin disposed in the space to seal the light emitting diode chip,
wherein the light-transmitting member includes at least one resin-injection inlet and at least one air vent, the resin-injection inlet and the air vent are diagonally disposed, and the space is filled with the resin.

* * * * *

UNITED STATES PATENT AND TRADEMARK OFFICE
CERTIFICATE OF CORRECTION

PATENT NO. : 7,728,342 B2
APPLICATION NO. : 11/647603
DATED : June 1, 2010
INVENTOR(S) : Kazuhiro Yoshida et al.

It is certified that error appears in the above-identified patent and that said Letters Patent is hereby corrected as shown below:

At claim 10, column 10, line 42, after the word "configured" insert --to--.

Signed and Sealed this

Ninth Day of November, 2010

David J. Kappos
*Director of the United States Patent and Trademark Office*